United States Patent
Kim et al.

(10) Patent No.: US 9,515,693 B2
(45) Date of Patent: Dec. 6, 2016

(54) CASING, PORTABLE ELECTRONIC ASSEMBLY HAVING THE SAME AND DISPLAY METHOD THEREOF

(71) Applicant: HTC Corporation, Taoyuan (TW)

(72) Inventors: Catherine Sayim Kim, San Francisco, CA (US); Maxence Sylvain Marie Joseph Derreumaux, San Francisco, CA (US); Chi Jen Lu, San Francisco, CA (US)

(73) Assignee: HTC Corporation, Taoyuan (TW)

(*) Notice: Subject to any disclaimer, the term of this patent is extended or adjusted under 35 U.S.C. 154(b) by 0 days.

(21) Appl. No.: 14/835,731

(22) Filed: Aug. 26, 2015

(65) Prior Publication Data
US 2016/0099740 A1    Apr. 7, 2016

Related U.S. Application Data (60) Provisional application No. 62/060,591, filed on Oct. 7, 2014.

(51) Int. Cl.
*H04B 1/3888*  (2015.01)
*G06F 1/16*  (2006.01)
(Continued)

(52) U.S. Cl.
CPC ............. *H04B 1/3888* (2013.01); *A45C 11/00* (2013.01); *G06F 1/166* (2013.01); *G06F 1/1686* (2013.01);
(Continued)

(58) Field of Classification Search
CPC ...... H04B 1/3888; G06F 1/166; G06F 1/1686; H05K 5/0017; H05K 5/0234
See application file for complete search history.

(56) References Cited

U.S. PATENT DOCUMENTS 8,412,289 B1 * 4/2013 Oh ................ H04M 1/03
                                             345/158
9,049,911 B1 * 6/2015 Wood ................ A45C 11/00
(Continued)

FOREIGN PATENT DOCUMENTS

EP    1798939    6/2007
EP    2728762    5/2014
(Continued)

OTHER PUBLICATIONS

"Office Action of Taiwan Counterpart Application", issued on Jun. 16, 2015, p. 1-5.
(Continued)

*Primary Examiner* — Hirdepal Singh
(74) *Attorney, Agent, or Firm* — Jianq Chyun IP Office (57) ABSTRACT

A casing applicable to a portable electronic device includes a supporter and a casing body having a back surface and side surfaces connecting to the back surface. The back surface has a camera opening for exposing a camera shutter of the portable electronic device and a supporter opening having a bevel side not parallel to the side surfaces. The supporter connected to the bevel side includes first and second sides which define a vertex angle. The supporter is adapted to rotate between a covering position and a supporting position. When at the covering position, the supporter covers the supporter opening, and the vertex angle and the camera opening are arranged diagonally. When the supporter is at the supporting position, the casing is supported by the vertex angle and one of the side surfaces away from the camera opening for the portable electronic device to perform landscape or portrait display.

30 Claims, 5 Drawing Sheets

(51) Int. Cl.
  *H05K 5/00* (2006.01)
  *H05K 5/02* (2006.01)
  *H04M 1/04* (2006.01)
  *A45C 11/00* (2006.01)
  *H04B 1/3877* (2015.01)
  *H04M 1/18* (2006.01)

(52) U.S. Cl.
  CPC ............ *H04B 1/3877* (2013.01); *H04M 1/04* (2013.01); *H05K 5/0017* (2013.01); *H05K 5/0234* (2013.01); *A45C 2011/002* (2013.01); *H04M 1/185* (2013.01)

(56) References Cited

U.S. PATENT DOCUMENTS

| | | |
|---|---|---|
| 2006/0091222 A1 | 5/2006 | Leung et al. |
| 2010/0304795 A1 | 12/2010 | Laine et al. |
| 2011/0003616 A1 | 1/2011 | Gorsica et al. |
| 2011/0259788 A1 | 10/2011 | Zeliff et al. |
| 2012/0106040 A1 | 5/2012 | Li et al. |
| 2012/0168577 A1 | 7/2012 | Cheng |
| 2013/0030892 A1* | 1/2013 | Liu ........................ G06Q 30/02 705/14.16 |
| 2013/0075543 A1 | 3/2013 | Krohn et al. |
| 2014/0061071 A1* | 3/2014 | Kim ........................ G06F 1/166 206/45.2 |
| 2014/0102924 A1 | 4/2014 | Chang |
| 2015/0372708 A1* | 12/2015 | Chiou .................. H04B 1/3888 455/575.8 |

FOREIGN PATENT DOCUMENTS

| | | |
|---|---|---|
| TW | D160839 | 6/2014 |
| TW | D163711 | 10/2014 |

OTHER PUBLICATIONS

"Office Action of European Counterpart Application", issued on Feb. 8, 2016, p. 1-8.
Office Action of Europe Counterpart Application, issued on May 31, 2016, p.1-p.14.

\* cited by examiner

CASING, PORTABLE ELECTRONIC ASSEMBLY HAVING THE SAME AND DISPLAY METHOD THEREOF

CROSS-REFERENCE TO RELATED APPLICATION

This application claims the priority benefits of U.S. provisional application Ser. No. 62/060,591, filed on Oct. 7, 2014. The entirety of the above-mentioned patent application is hereby incorporated by reference herein and made a part of this specification.

BACKGROUND OF THE INVENTION

Field of the Invention

The present invention generally relates to a casing, a portable electronic assembly and a display method. More particularly, the present invention relates to a casing, a portable electronic assembly having the casing and a display method of the portable electronic assembly.

Description of Related Art

Portable electronic devices are suitable to be carried by a user. However, a portable electronic device may be damaged due to be bumped or hit, or wear down the outer casing, when being carried. In order to avoid damage, a protective cover is generally used to cover the portable electronic device for protection.

In addition, when viewing some information on a portable electronic device such as a tablet PC, the portable electronic device is usually disposed on a supporter with a suitable angle for the user to use. Thus, not only a protective cover is required, but also a supporter, thus to improve the convenience while using. However, buying and carrying multiple items is a burden for the user.

SUMMARY OF THE INVENTION

Accordingly, the present invention is directed to a casing which is capable of covering and protecting a portable electronic device and also supporting the portable electronic device with a suitable angle for the user to use.

The present invention is directed to a portable electronic assembly having the above-mentioned casing.

The present invention is further directed to a display method of the above-mentioned portable electronic assembly for the portable electronic device to display in landscape mode or portrait mode.

The present invention provides a casing applicable to a portable electronic device. The casing includes a casing body and a supporter. The casing body includes a back surface and a plurality of side surfaces connecting to the back surface. The back surface has a camera opening for exposing a camera shutter of the portable electronic device and a supporter opening having a bevel side not parallel to any of the side surfaces. The supporter is connected to the bevel side and includes a first side and a second side, wherein the first side and the second side define a vertex angle. The supporter is adapted to rotate about the bevel side between a covering position and a supporting position. When the supporter is at the covering position, the supporter covers the supporter opening, and the vertex angle and the camera opening are arranged diagonally. When the supporter is at the supporting position, the casing is supported by the vertex angle and one of the side surfaces away from the camera opening for the portable electronic device to perform a landscape display or a portrait display.

The present invention provides a portable electronic assembly. The portable electronic assembly includes a portable electronic device and a casing. The portable electronic device includes a display, a camera shutter, a first surface and a second surface opposite to the first surface, wherein the display is disposed on the first surface and the cameral shutter is disposed on the second surface. The casing partially covers the portable electronic device and exposes the first surface. The casing includes a casing body and a supporter. The casing body includes a back surface and a plurality of side surfaces connecting to the back surface. The back surface has a camera opening for exposing the camera shutter and a supporter opening having a bevel side not parallel to any of the side surfaces. The supporter is connected to the bevel side and includes a first side and a second side, wherein the first side and the second side define a vertex angle. The supporter is adapted to rotate about the bevel side between a covering position and a supporting position. When the supporter is at the covering position, the supporter covers the supporter opening, and the vertex angle and the camera opening are arranged diagonally. When the supporter is at the supporting position, the portable electronic device is supported by the vertex angle and one of the side surfaces away from the camera opening to perform a landscape display or a portrait display.

The present invention further provides a display method of a portable electronic assembly, wherein the portable electronic assembly includes a portable electronic device and a casing partially covering the portable electronic device and including a casing body and a supporter. The method includes the following steps. Firstly, whether the supporter is at a covering position for covering the portable electronic device or at a supporting position for supporting the portable electronic device via the first side or the second side of the supporter is detected. Next, an orientation state of the portable electronic device is detected if the supporter is at the supporting position. Then, a landscape display or a portrait display is performed according to the orientation state of the portable electronic device.

Based on the description above, the casing of the present invention is configured for partially covering a portable electronic device to form a portable electronic assembly therewith. The casing includes a supporter adapted to rotate relatively to the casing body to be at a covering position and a supporting position. When the supporter is at the covering position, the supporter covers and protects the portable electronic device, and when the supporter is at the supporting position, the portable electronic device is supported by the supporter to perform a landscape display or a portrait display. Therefore, the casing of the present invention is capable of covering and protecting the portable electronic device and also supporting the portable electronic device with a suitable angle for a user to use.

In addition, a display method for the portable electronic assembly having the casing and the portable electronic device is also developed. When the first sensor detects the supporter being at the supporting position, the orientation state of the portable electronic device is detected. Accordingly, the portable electronic device determines to perform a landscape display or a portrait display according to the orientation state of the portable electronic device. Therefore, the portable electronic assembly can automatically perform a landscape display or a portrait display according to the position of the supporter and the orientation state of the portable electronic device, which further increases the convenience in use.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top", "bottom", "front", or "back", etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to." Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Reference will now be made in detail to the present preferred embodiments of the invention, examples of which are illustrated in the accompanying drawings. Wherever possible, the same reference numbers are used in the drawings and the description to refer to the same or like parts.

Figure 1:
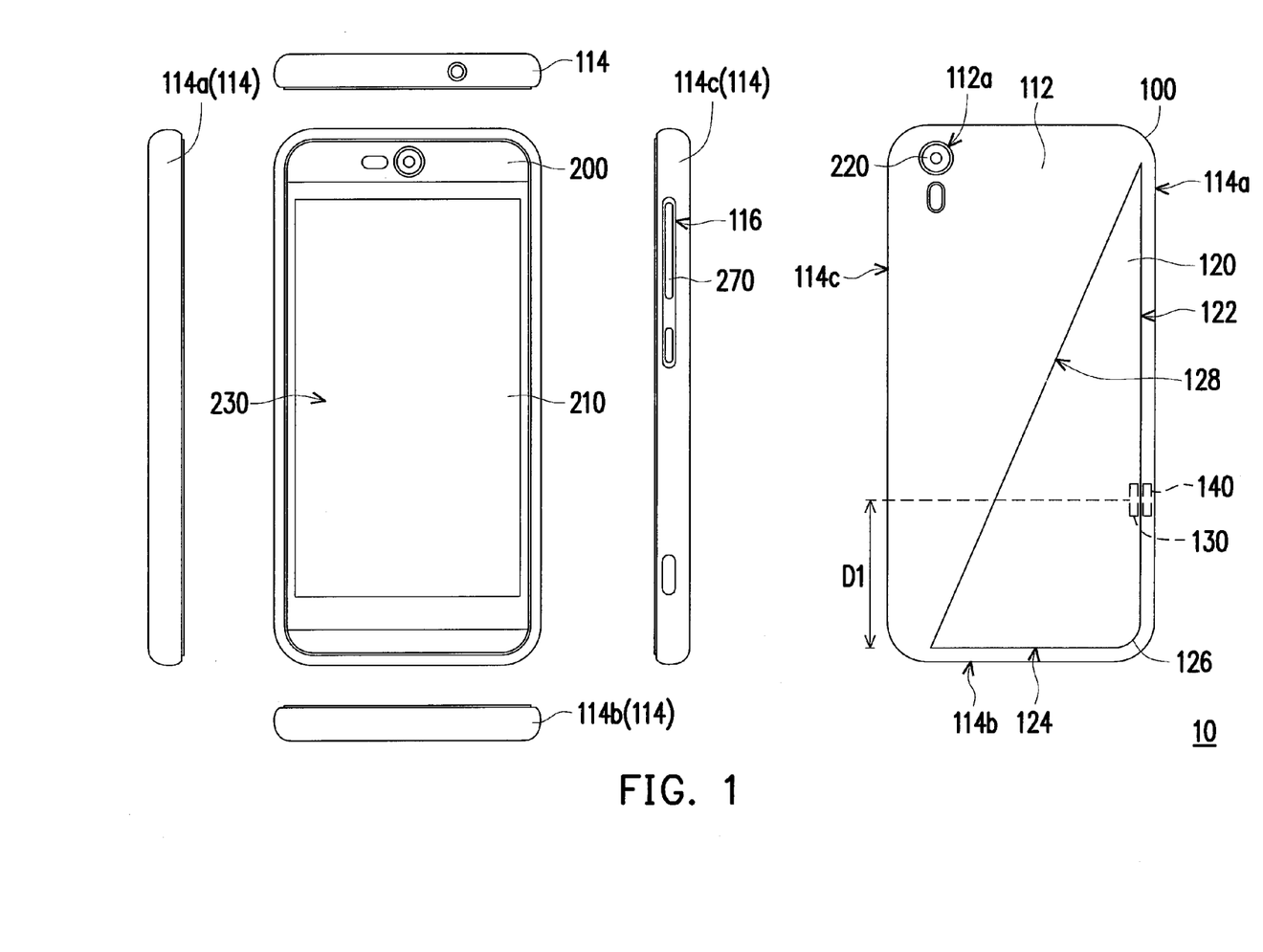
FIG. 1 illustrates 6-sided views of a portable electronic assembly according to an exemplary embodiment.
Figure 2:
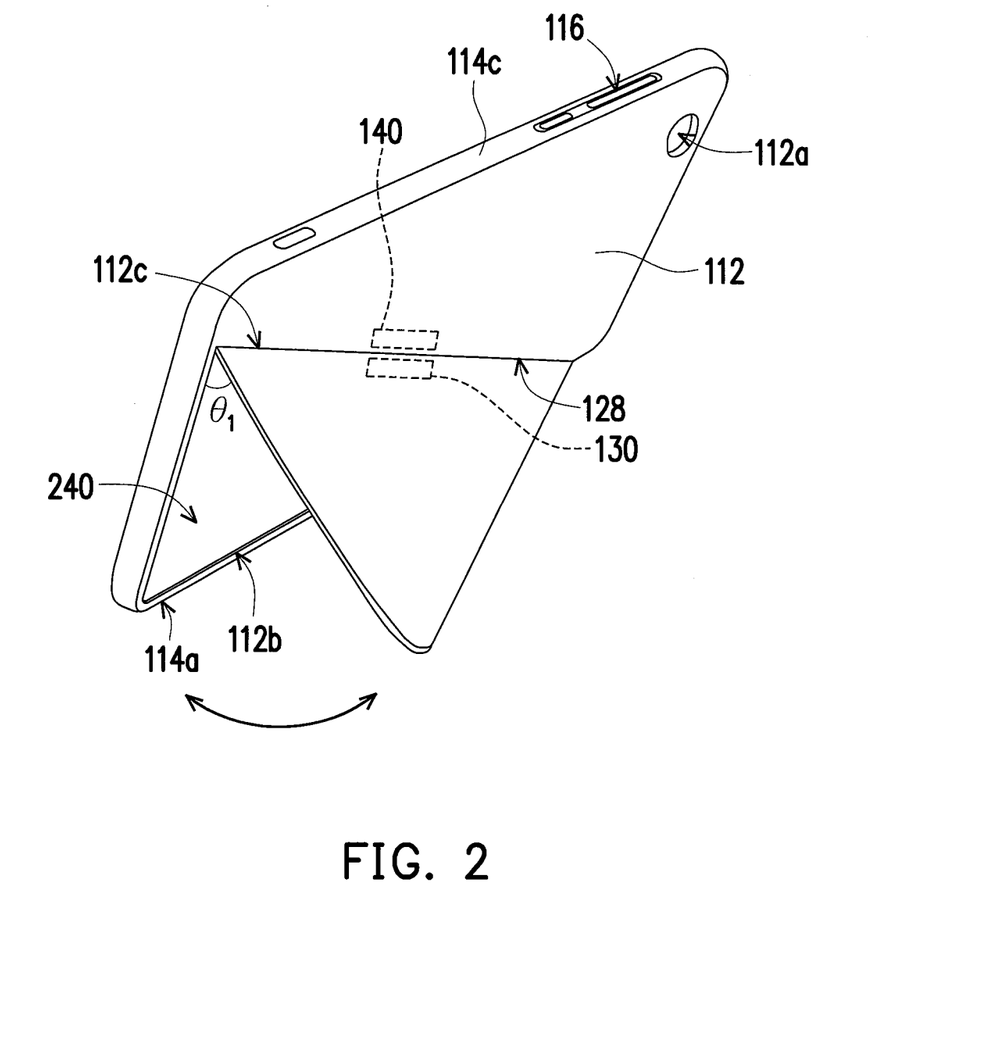
FIG. 2 illustrates a schematic view of the portable electronic assembly in a landscape display according to an exemplary embodiment.
Figure 3:
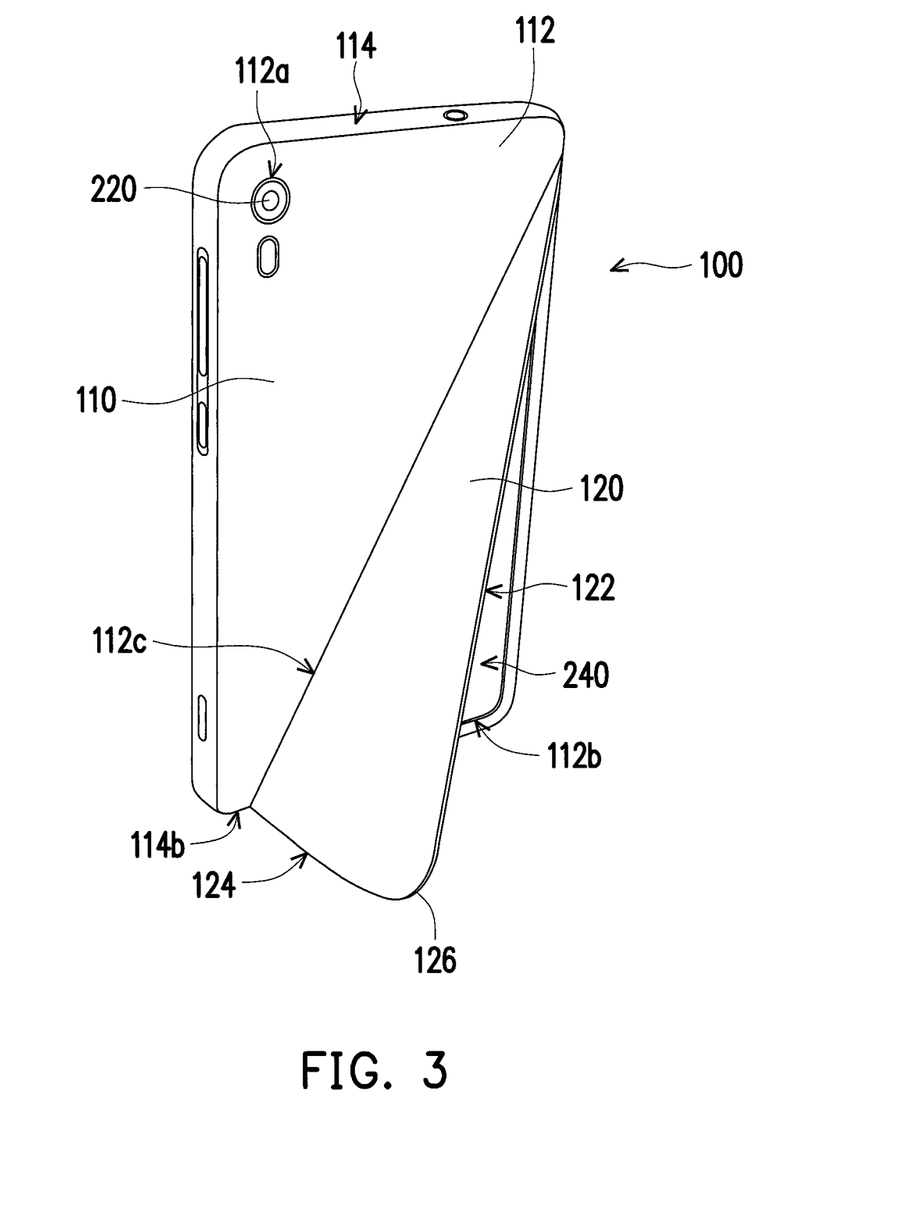
FIG. 3 illustrates a schematic view of the portable electronic assembly in a portrait display according to an exemplary embodiment.

FIG. 1 illustrates 6-sided views of a casing according to an exemplary embodiment. FIG. 2 illustrates a schematic view of the portable electronic assembly in FIG. 1 in a landscape display. FIG. 3 illustrates a schematic view of the portable electronic assembly in FIG. 1 in a portrait display. Firstly referring to FIG. 1 and FIG. 2, in the present embodiment, a portable electronic assembly 10 includes a casing 100 and a portable electronic device 200. The casing 100 is applicable to the portable electronic device 200 for partially covering and protecting the portable electronic device 200. The portable electronic device 200 includes a display 210, a camera shutter 220, a first surface 230 and a second surface 240 opposite to the first surface 230. The display 210 is disposed on the first surface 230 and the cameral shutter 220 is disposed on the second surface 240. The casing 100 partially covers the portable electronic device 200 and exposes the first surface 230 and the display 210 as shown in FIG. 1.

In detail, the casing 100 includes a casing body 110 and a supporter 120. The casing body 110 includes a back surface 112 and a plurality of side surfaces 114 connecting to the back surface 112. The back surface 112 has a camera opening 112a and a supporter opening 112b. The camera opening 112a is configured for exposing the camera shutter 220 of the portable electronic device 200. The supporter opening 112b has a bevel side 112c as shown in FIG. 2 which is not parallel to any of the side surfaces 114. The supporter 120 is connected to the bevel side 112c and includes a first side 122 and a second side 124 which together define a vertex angle 126 as shown in FIG. 1. The supporter 120 is adapted to rotate about the bevel side 112c, so as to rotate between a covering position as shown in FIG. 1 and a supporting position as shown in FIG. 2 and FIG. 3.

In the present embodiment, when the supporter 120 is at the covering position as shown in FIG. 1, the supporter 120 covers the supporter opening 112b for covering and protecting the portable electronic device 200. Also, when the supporter 120 is at the covering position, the vertex angle 126 and the camera opening 112a are arranged diagonally, so the supporter 120 would not interfere with the operation of the camera shutter 220. When the supporter 120 is at the supporting position as shown in FIG. 2 and FIG. 3, the casing 100 and the portable electronic device 200 are supported by the vertex angle 126 and one of the side surfaces 114 away from the camera opening 112a for the portable electronic device 200 to perform a landscape display as shown in FIG. 2 or a portrait display as shown in FIG. 3.

To be more specific, when the portable electronic device 200 is supported by the vertex angle 126 and the side surface 114a as shown in FIG. 1, the portable electronic device 200 is adapted to perform a landscape display as shown in FIG. 2. When the portable electronic device 200 is supported by the vertex angle 126 and the side surface 114b as shown in FIG. 1, the portable electronic device 200 is adapted to perform a portrait display as shown in FIG. 3. It is noted that the side surfaces 114a and 114b are, for example, the side surfaces away from the camera opening 112a, such that when being at the supporting position as shown in FIG. 2 and FIG. 3, the supporter 120 would not interfere the operation of the camera shutter 220.

In addition, the casing body 110 may further include a bottom opening 116 for exposing, for example, a volume-control bottom 270 of the portable electronic device 200. In the present embodiment, the bottom opening 116 is disposed at one of the side surfaces 114 which is adjacent to the camera opening 112a. Specifically, the bottom opening 116 is disposed at the side surface 114c as shown in FIG. 1. As such, when the portable electronic device 200 is supported by the supporter 120 and the side surface 114a to be in the landscape display as shown in FIG. 2, the bottom opening 116 for exposing the volume-control bottom 270 would face away from the side surface 114a, so the user has access to the volume-control bottom 270 for operating the volume-control function during the landscape display.

In the present embodiment, the casing may further include a first magnetic component 130 and a second magnetic 140, wherein the first magnetic component 130 is disposed at the supporter 120 and the second magnetic component 140 is disposed at the casing body 110 correspondingly. The first magnetic component 130 and the second magnetic component 140 are attracted to each other. To be more specific, the first magnetic component 130 may be, for example, disposed at the first side 122 as shown in FIG. 1, and the second magnetic component 140 are disposed correspondingly at the casing body 110. As such, when the supporter 120 is rotated to the covering position, the supporter 120 can be temporarily fixed to the covering position for covering and protecting the portable electronic device 200. In the present embodiment, the portable electronic device 200 may includes an antenna disposed at, for example, a location corresponding to the second side 124. Therefore, the first magnetic component 130 may keep a distance from the second side 124 in order to avoid interfering with the operation of the antenna. In the present embodiment, a shortest distance D1 from the first magnetic component 130 to the second side 124 is substantially from 30 mm to 40 mm.

Certainly, the embodiment described above is merely for illustration, and the invention is not limited thereto. In other embodiment, the supporter 120 further includes a connecting side 128 connected to the bevel side 112c, and the first magnetic component 130 may be disposed at the connecting side 128 and the second magnetic component 140 is disposed correspondingly at the casing body 110. In the present embodiment, a shielding layer may be disposed between an antenna of the portable electronic device 200 and the magnetic components 130, 140. The invention does not limit the disposition of the first magnetic component 130 and the second magnetic component 140.

Referring to FIG. 2, when the supporter 120 is at the supporting position, an included angle $\theta_1$ is formed between an inner surface of the supporter 120 facing the supporter opening 122b and the back surface 112, and the included angle $\theta_1$ may range from 68 degrees to 72 degrees which is the best view angle for a user. Also, with the range of the included angle $\theta_1$, when the supporter 120 is at the supporting position as shown in FIGS. 2 and 3, a normal projection of a center of mass of the portable electronic assembly 10 would fall within a normal projection of the supporter 120 on a horizontal plane, so the portable electronic assembly 10 is in a stable balance when in landscape display or in portrait display.

Figure 4:
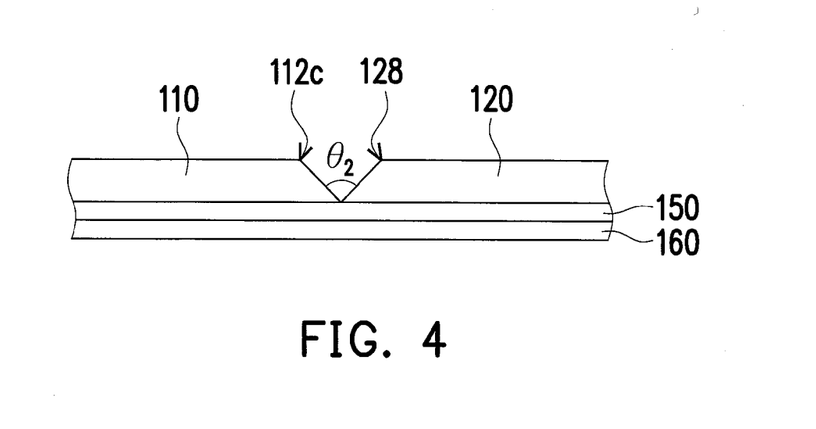
FIG. 4 illustrates a partial cross-sectional view of the casing at a covering position according to an exemplary embodiment.

FIG. 4 illustrates a partial cross-sectional view of the casing at a covering position according to an exemplary embodiment. In the present embodiment, when the supporter 120 is at the covering position, the connecting side 128 and the bevel side 112c define a V-shaped groove as shown in FIG. 4, so the supporter 120 can rotate about the bevel side 112c. An included angle $\theta_2$ of the V-shaped groove may be designate to substantially range from 32 degrees to 40 degrees such that the included angle $\theta_1$ may substantially range from 70 degrees to 74 degrees as it is described above.

In addition, the casing 100 may further include an adhesive layer 150 and a micro fiber layer 160 as shown in FIG. 4. The adhesive layer 150 is configured for connecting the supporter 120 and the casing body 110, wherein the supporter 120 and the casing body 110 are disposed on the adhesive layer 150 and the adhesive layer 150 is disposed on the micro fiber layer 160. In other words, the supporter 120 and the casing body 110 are connected to each other through the micro fiber layer 160 by the adhesion of the adhesive layer 150.

Figure 5:
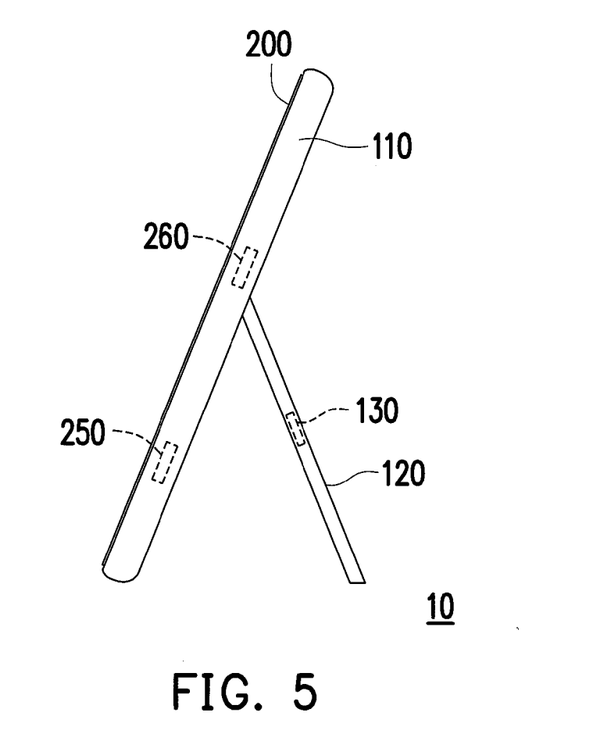
FIG. 5 illustrates a side view of the portable electronic assembly at a supporting position according to an exemplary embodiment.

FIG. 5 illustrates a side view of the portable electronic assembly at a supporting position according to an exemplary embodiment. Referring to FIG. 5, in the present embodiment, the portable electronic device 200 may further include a first sensor 250 for detecting whether the supporter 120 is at the covering position or at the supporting position. In the present embodiment, the first sensor comprises a Hall effect sensor. In general, the Hall effect sensor may sense a magnetic force emitted by the first magnetic component 130 disposed on the supporter 120. As such, when the supporter 120 moves, the magnetic force applied by the first magnetic component 130 on the Hall effect sensor changes, and thus the induced voltage of the carrier of the Hall effect sensor varies accordingly. Accordingly, the portable electronic device 200 detects the voltage variations of the Hall effect sensor, and determines whether the supporter 120 is at the covering position or at the supporting position according to the voltage variations, thereby achieving the positioning and position detection functions.

In addition, the portable electronic device 200 may further include a second sensor 260 for detecting an orientation state of the portable electronic device 200. As such, the portable electronic device 200 determine to perform the landscape display or the portrait display according to the orientation state of the portable electronic device 200 detected by the second sensor 260. To be more specific, the portable electronic device 200 determines to perform the landscape display if the second sensor 260 detects the portable electronic device 200 is in the landscape position as shown in FIG. 2, and the portable electronic device 200 determines to perform the portrait display if the second sensor 260 detects the portable electronic device 200 is in the portrait position as shown in FIG. 3. In the present embodiment, the second sensor 260 includes a gravity sensor.

Figure 6:
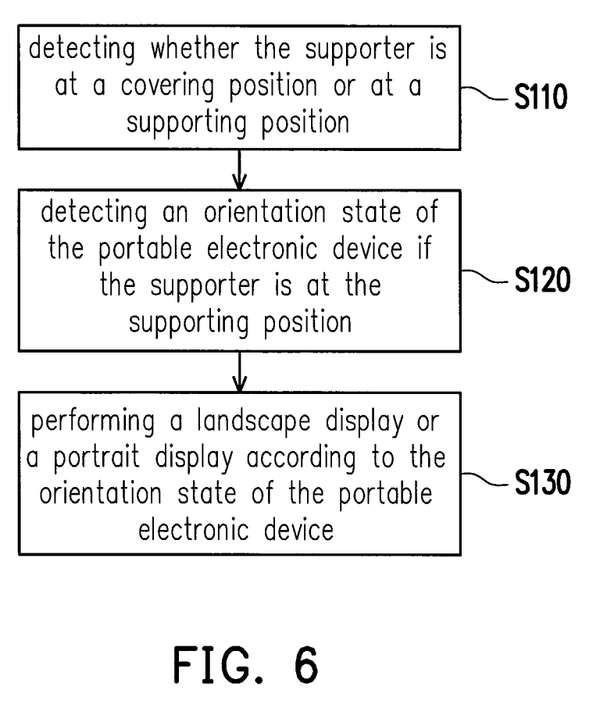
FIG. 6 illustrates a flow chart of a display method of a portable electronic assembly according to an exemplary embodiment.

FIG. 6 illustrates a flow chart of a display method of a portable electronic assembly according to an exemplary embodiment. Referring to FIGS. 1, 5 and 6, with the disposition described above, a display method for the portable electronic assembly 10 as shown in FIG. 5 is developed, and the display method includes the following steps. Firstly, whether the supporter 120 is at a covering position or at a supporting position is detected (performing step S110). In detail, when the supporter 120 is at the covering position, the supporter 120 covers and protect the portable electronic device 200, and when the supporter 120 is at the supporting position, the portable electronic device 200 is supported by the first side 122 or the second side 124 of the supporter 120. Next, an orientation state of the portable electronic device 200 is detected if the supporter 120 is at the supporting position (performing step S120). In other words, if the supporter 120 is detected to be at the supporting position, an orientation state of the portable electronic device 200 is detected to see whether the portable electronic device 200 is in a landscape position or in a portrait position. Then, a landscape display or a portrait display is performed according to the orientation state of the portable electronic device 200 (performing step S130).

To be more specific, the orientation state of the portable electronic device 200 includes a landscape orientation state and a portrait orientation state. The portable electronic device 200 determines to perform the landscape display if the portable electronic device 200 is detected to be in the landscape orientation state as shown in FIG. 2, and the portable electronic device 200 determines to perform the portrait display if the portable electronic device 200 is detected to be in the portrait orientation state as shown in FIG. 3. In addition, an interactive function may be triggered if the portable electronic device 200 is detected to be in the landscape orientation state. For example, an interactive dialogue may be shown on the display 210 of the portable electronic device 200 for requiring a user's input.

As it is described above, the portable electronic device 200 may include the first sensor 250 and the second sensor 260. The first sensor 250 is configured for detecting whether the supporter 120 is at the covering position or at the supporting position. The second sensor 260 is configured for detecting the orientation state of the portable electronic device 200. In the present embodiment, when the first sensor 250 detects the supporter 120 being at the supporting position, the second sensor 260 is triggered to detect the orientation state of the portable electronic device 200. Accordingly, the portable electronic device 200 determines to perform the landscape display if the portable electronic device 200 is detected to be in the landscape orientation state, and the portable electronic device 200 determines to perform the portrait display if the portable electronic device 200 is detected to be in the portrait orientation state.

In sum, the casing of the present invention is configured for partially covering a portable electronic device to form a portable electronic assembly therewith. The casing includes a supporter adapted to rotate relatively to the casing body to be at a covering position and a supporting position. When the supporter is at the covering position, the supporter covers and protects the portable electronic device, and when the supporter is at the supporting position, the portable electronic device is supported by the supporter to perform a landscape display or a portrait display. Therefore, the casing of the present invention is capable of covering and protecting the portable electronic device and also supporting the portable electronic device with a suitable angle for a user to use.

In addition, a display method for the portable electronic assembly having the casing and the portable electronic device is also developed, wherein the portable electronic device includes the first sensor for detecting whether the supporter is at the covering position or at the supporting position and the second sensor for detecting the orientation state of the portable electronic device. As such, when the first sensor detects the supporter being at the supporting position, the second sensor is triggered to detect the orientation state of the portable electronic device. Accordingly, the portable electronic device determines to perform a landscape display or a portrait display according to the orientation state of the portable electronic device. Therefore, the portable electronic assembly can automatically perform a landscape display or a portrait display according to the position of the supporter and the orientation state of the portable electronic device, which further increases the convenience in use.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A casing, applicable to a portable electronic device, the casing comprising:
   a casing body comprising a back surface covering the rear of the electronic device and a plurality of side surfaces connecting to the back surface, the back surface having a camera opening for exposing a camera shutter of the portable electronic device and having a supporter opening with a bevel side not parallel to any of the side surfaces, the side surfaces surrounding the electronic device; and
   a supporter connected to the bevel side and comprising a first side and a second side, wherein the first side and the second side define a vertex angle, the supporter is adapted to rotate about the bevel side between a covering position and a supporting position, when the supporter is at the covering position, the supporter covers the supporter opening, and the vertex angle and the camera opening are arranged diagonally, when the supporter is at the supporting position, the casing is supported by the vertex angle and one of the side surfaces away from the camera opening for the portable electronic device to perform a landscape display or a portrait display.

2. The casing as claimed in claim 1, further comprising a first magnetic component disposed at the supporter and a second magnetic component disposed at the casing body correspondingly, wherein the first magnetic component and the second magnetic component are attracted to each other.

3. The casing as claimed in claim 2, wherein the first magnetic component is disposed at the first side.

4. The casing as claimed in claim 3, wherein a shortest distance from the first magnetic component to the second side is from 30 mm to 40 min.

5. The casing as claimed in claim 2, wherein the supporter further comprises a connecting side connected to the bevel side, the first magnetic component is disposed at the connecting side.

6. The casing as claimed in claim 5, wherein when the supporter is at the covering position, the connecting side and the bevel side define a V-shaped groove.

7. The casing as claimed in claim 1, wherein when the supporter is at the supporting position, an included angle is formed between an inner surface of the supporter facing the supporter opening and the back surface, and the included angle ranges from 68 degrees to 72 degrees.

8. The casing as claimed in claim 1, further comprising a micro fiber layer and an adhesive layer for connecting the supporter and the casing body, wherein the supporter and the casing body are disposed on the adhesive layer and the adhesive layer is disposed on the micro fiber layer.

9. The casing as claimed in claim 1, wherein when the supporter is at the supporting position, a normal projection of a center of mass of the casing is located within a normal projection of the supporter on a horizontal plane.

10. The casing as claimed in claim 1, wherein the casing body further comprises a bottom opening for exposing a volume-control bottom of the portable electronic device, the bottom opening is disposed at one of the side surfaces adjacent to the camera opening.

11. A portable electronic assembly, comprising:
a portable electronic device comprising a display, a camera shutter, a first surface and a second surface opposite to the first surface, wherein the display is disposed on the first surface and the cameral shutter is disposed on the second surface; and
a casing partially covering the portable electronic device and exposing the first surface, the casing comprising:
a casing body comprising a back surface and a plurality of side surfaces connecting to the back surface, the back surface having a camera opening for exposing the camera shutter and having a supporter opening with a bevel side not parallel to any of the side surfaces, wherein the back surface covers the second surface and the side surfaces surround the portable electronic device; and
a supporter connected to the bevel side and comprising a first side and a second side, wherein the first side and the second side defines a vertex angle, the supporter is adapted to rotate about the bevel side between a covering position and a supporting position, when the supporter is at the covering position, the supporter covers the supporter opening, and the vertex angle and the camera opening are arranged diagonally, when the supporter is at the supporting position, the portable electronic device is supported by the vertex angle and one of the side surfaces away from the camera opening to perform landscape display or a portrait display.

12. The portable electronic assembly as claimed in claim 11, wherein the casing further comprises a first magnetic component disposed at the supporter and a second magnetic component disposed at the casing body correspondingly, and the first magnetic component and the second magnetic component are attracted to each other for temporarily fixing the supporter to cover the supporter opening.

13. The portable electronic assembly as claimed in claim 12, wherein the first magnetic component is disposed at the first side.

14. The portable electronic assembly as claimed in claim 13, wherein the portable electronic device further comprises an antenna disposed at a position corresponding to the second side.

15. The portable electronic assembly as claimed in claim 13, wherein a shortest distance from the first magnetic component to the second side is from 30 mm to 40 mm.

16. The portable electronic assembly as claimed in claim 12, wherein the supporter further comprises a connecting side connected to the bevel side, the first magnetic component is disposed at the connecting side.

17. The portable electronic assembly as claimed in claim 16, wherein when the supporter is at the covering position, the connecting side and the bevel side define a V-shaped groove.

18. The portable electronic assembly as claimed in claim 11, wherein when the supporter is at the supporting position, an included angle is formed between an inner surface of the supporter facing the supporter opening and the back surface, and the included angle ranges from 68 degrees to 72 degrees.

19. The portable electronic assembly as claimed in claim 11, wherein the casing further comprises a micro fiber layer and an adhesive layer for connecting the supporter and the casing body, and the supporter and the casing body are disposed on the adhesive layer and the adhesive layer is disposed on the micro fiber layer.

20. The portable electronic assembly as claimed in claim 11, wherein when the supporter is at the supporting position, a normal projection of a center of mass of the casing is located within a normal projection of the supporter on a horizontal plane.

21. The portable electronic assembly as claimed in claim 11, wherein the casing body further comprises a bottom opening for exposing a volume-control bottom of the portable electronic device, the bottom opening is disposed at one of the side surfaces adjacent to the camera opening.

22. The portable electronic assembly as claimed in claim 11, wherein the portable electronic device further comprises a first sensor for detecting the supporter is at the covering position or at the supporting position.

23. The portable electronic assembly as claimed in claim 22, wherein the first sensor comprises a Hall effect sensor.

24. The portable electronic assembly as claimed in claim 11, wherein the portable electronic device further comprises a second sensor for detecting an orientation state of the portable electronic device, the portable electronic device determine to perform the landscape display or the portrait display according to the orientation state of the portable electronic device detected by the second sensor.

25. The portable electronic assembly as claimed in claim 24, wherein the second sensor comprises a gravity sensor.

26. A display method of a portable electronic assembly, wherein the portable electronic assembly comprises a portable electronic device and a casing partially covering the portable electronic device and comprising a casing body and a supporter, the method comprising:
detecting whether the supporter is at a covering position at the back of the portable electronic device for covering the portable electronic device or at a supporting position at the back of the portable electronic device for supporting the portable electronic device via a first side or a second side of the supporter;
detecting an orientation state of the portable electronic device with the supporter at the supporting position; and
performing a landscape display or a portrait display according to the orientation state of the portable electronic device.

27. The display method as claimed in claim 26, wherein the orientation state of the portable electronic device comprises a landscape orientation state and a portrait orientation state, when in the landscape orientation state, the portable electronic device performs the landscape display, and when in the portrait orientation state, the portable electronic device performs the portrait display.

28. The display method as claimed in claim 27, further comprising:
triggering an interactive function if the portable electronic device is in the landscape orientation state.

29. The display method as claimed in claim 26, wherein the portable electronic device further comprises a first sensor for detecting the supporter is at the covering position or at the supporting position and a second sensor for detecting the orientation state of the portable electronic device, the method further comprises:
triggering the second sensor when the first sensor detects the supporter being at the supporting position.

30. The display method as claimed in claim 29, wherein the first sensor comprises a Hall effect sensor and the second sensor comprises a gravity sensor.

* * * * *